(12) United States Patent
Lin

(10) Patent No.: US 11,768,396 B1
(45) Date of Patent: Sep. 26, 2023

(54) HUMAN-MACHINE INTERFACE MODULE STRUCTURE

(71) Applicant: Chyng Hong Electronic Co., Ltd., Taichung (TW)

(72) Inventor: Mu-Chun Lin, Taichung (TW)

(73) Assignee: CHYNG HONG ELECTRONIC CO., LTD., Taichung (TW)

( * ) Notice: Subject to any disclaimer, the term of this patent is extended or adjusted under 35 U.S.C. 154(b) by 0 days.

(21) Appl. No.: 17/932,107

(22) Filed: Sep. 14, 2022

(51) Int. Cl.
  *G02F 1/1333* (2006.01)
  *H05K 1/14* (2006.01)

(52) U.S. Cl.
  CPC .... *G02F 1/13338* (2013.01); *G02F 1/133308* (2013.01); *H05K 1/144* (2013.01); *H05K 2201/042* (2013.01); *H05K 2201/10136* (2013.01)

(58) Field of Classification Search
  CPC .......... G02F 1/13338; G02F 1/133308; H05K 1/144; H05K 2201/042; H05K 2201/10136
  See application file for complete search history.

(56) References Cited

U.S. PATENT DOCUMENTS

| | | | |
|---|---|---|---|
| 2020/0133068 A1* | 4/2020 | Lu | G02B 6/0073 |
| 2020/0253049 A1* | 8/2020 | Kinoshita | H05K 1/0215 |
| 2021/0325734 A1* | 10/2021 | Zhou | G02F 1/133608 |
| 2022/0201860 A1* | 6/2022 | Kim | H05K 9/0024 |

* cited by examiner

*Primary Examiner* — Mariam Qureshi
(74) *Attorney, Agent, or Firm* — Sinorica International Patent & Trademark

(57) ABSTRACT

A human-machine interface module structure includes a circuit module, a retaining seat, and a liquid crystal panel. The circuit module is fixedly connected to a frame. The circuit module includes a first circuit board and a second circuit board that are stacked in parallel. The first circuit board is fixedly connected to an inner side of the frame. The second circuit board is located behind the first circuit board. The first circuit board is electrically connected to the second circuit board. The retaining seat is parallel with and connected to the first circuit board. A front of the retaining seat has an accommodating space. The liquid crystal panel is accommodated in the accommodating space. The liquid crystal panel is electrically connected to the first circuit board through a flat flexible cable. The human-machine interface module structure is small in size and is easy to assemble and durable.

1 Claim, 7 Drawing Sheets

HUMAN-MACHINE INTERFACE MODULE STRUCTURE

FIELD OF THE INVENTION

The present invention relates to a human-machine interface, and more particularly to a human-machine interface module structure.

BACKGROUND OF THE INVENTION

With the development of industrial automation, a human-machine interface has been widely used in many equipment and machines. The human-machine interface (HMI) is also known as an operator interface (OI). The main function of the human-machine interface is to provide an interface for a user to communicate with a machine. The human-machine interface can display the process or mechanical status of a system, alarm messages and other related information in text, numbers or graphics.

The human-machine interface uses various buttons, switches and indicators of different colors, sizes and appearances to operate the equipment and display the operating status, such as power on and off, etc. The human-machine interface can use a flat panel display (FPD) as an auxiliary device, so that the operator can further understand the required state of the equipment or transmit information to the operator for reference. The commonly used displays include light-emitting displays (LED) or liquid crystal displays (LCD), etc. The buttons, switches and indicators are integrated with the display to constitute a human-machine interface module.

However, in addition to being easy to operate and easy to read, the industry intends to improve the human-machine interface to reduce the volume in structure and have the advantages of easy assembly, sturdiness and durability by.

Accordingly, the inventor of the present invention has devoted himself based on his many years of practical experiences to solve these problems.

SUMMARY OF THE INVENTION

The primary object of the present invention is to provide a human-machine interface module structure, which is not only small in size but also has the advantages of being easy to assemble and durable.

In order to achieve the above object, a human-machine interface module structure provided by the present invention comprises a circuit module, a retaining seat, and a liquid crystal panel. The circuit module is fixedly connected to a frame. The circuit module includes a first circuit board and a second circuit board that are stacked in parallel. The first circuit board is fixedly connected to an inner side of the frame. The second circuit board is located behind the first circuit board. The first circuit board is electrically connected to the second circuit board. Two side edges of the first circuit board have a plurality of engaging notches, respectively. The retaining seat is parallel with and connected to the first circuit board. The retaining seat is located in front of the first circuit board. A front of the retaining seat has an accommodating space. The retaining seat further has a plurality of engaging legs extending backward from two sides of the retaining seat and corresponding to the engaging notches. The engaging legs are engaged with the engaging notches of the first circuit board so that the retaining seat is connected to the first circuit board. A plurality of protruding posts is disposed on a back of the retaining seat to lean against the first circuit board. The liquid crystal panel is accommodated in the accommodating space. The liquid crystal panel is electrically connected to the first circuit board through a flat flexible cable.

DETAILED DESCRIPTION OF THE PREFERRED EMBODIMENTS

Figure 1:
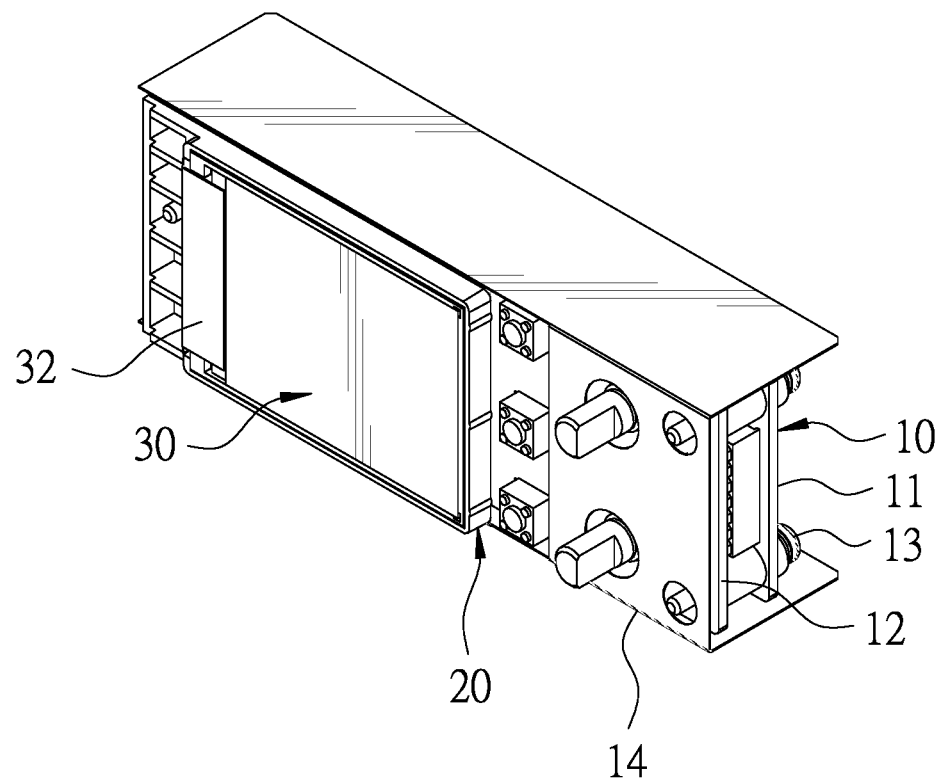
FIG. 1 is a perspective view of a preferred embodiment of the present invention.
Figure 2:
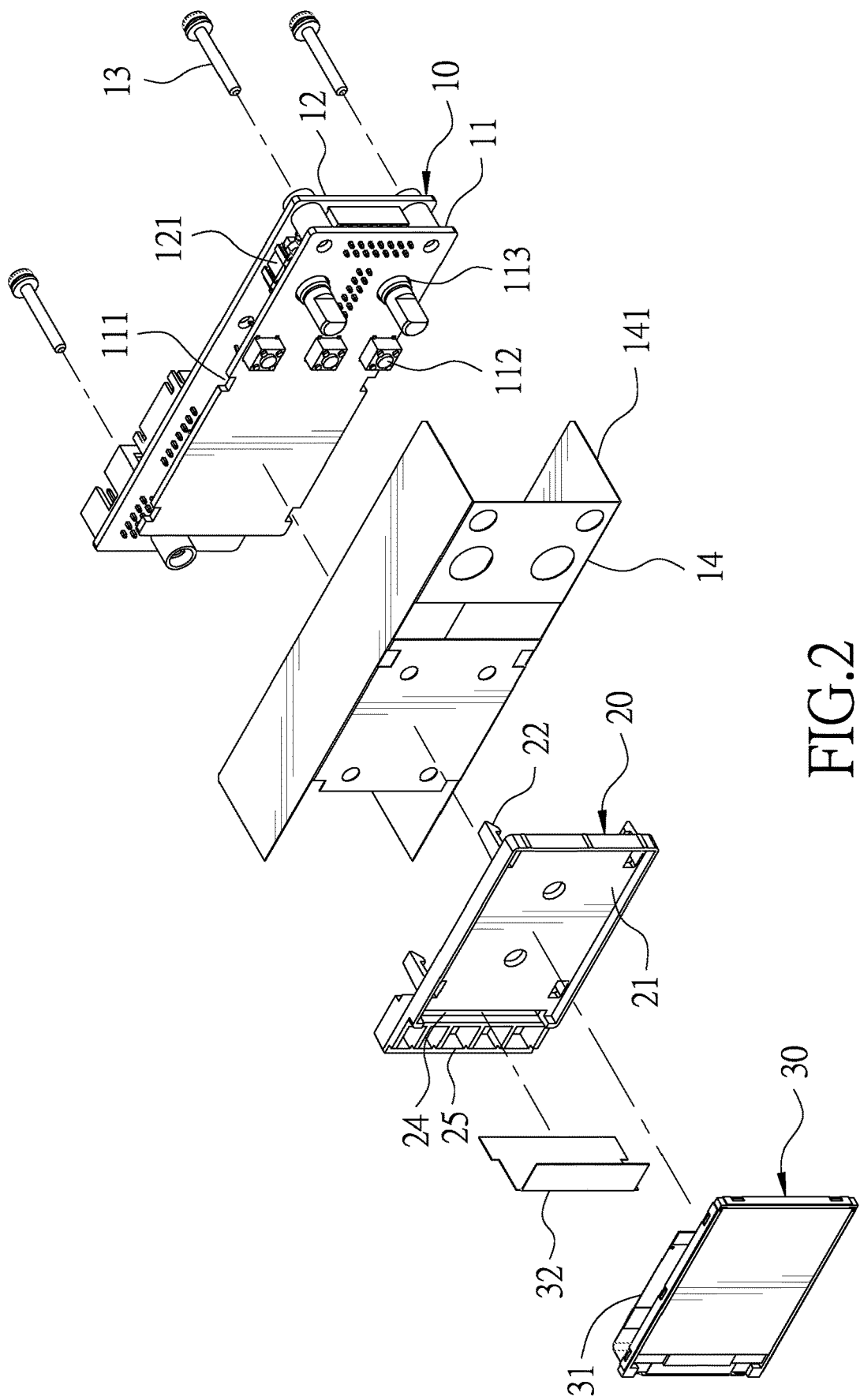
FIG. 2 is an exploded view of the preferred embodiment of the present invention.
Figure 3:
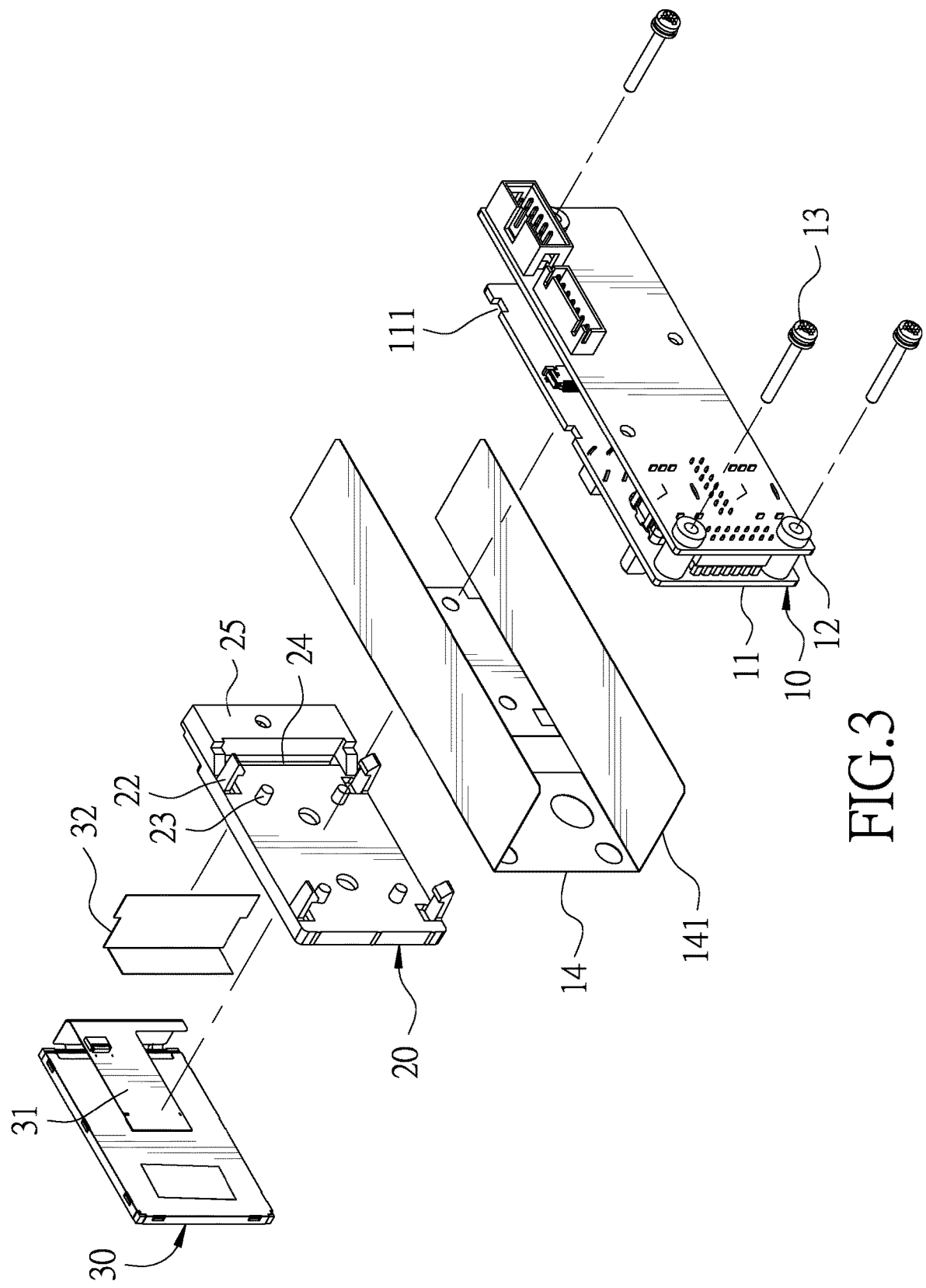
FIG. 3 is another exploded view of the preferred embodiment of the present invention.
Figure 4:
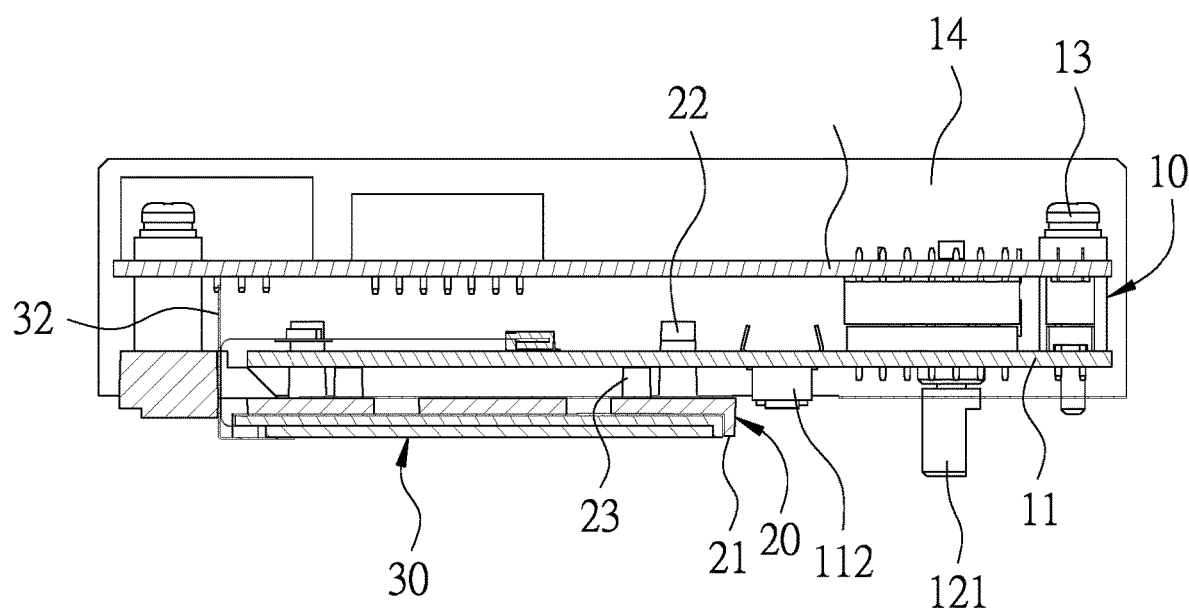
FIG. 4 is a cross-sectional view of the preferred embodiment of the present invention.

Embodiments of the present invention will now be described, by way of example only, with reference to the accompanying drawings.

Referring to FIGS. 1 to 7, the present invention comprises a human-machine interface module structure, comprising a circuit module 10, a retaining seat 20, and a liquid crystal panel 30.

The circuit module 10 includes a first circuit board 11 and a second circuit board 12 that are stacked in parallel. The first circuit board 11 and the second circuit board 12 are locked by a plurality of screws 13. The second circuit board 12 is located behind the first circuit board 11. The first circuit board 11 is electrically connected to the second circuit board 12. Two side edges of the first circuit board 11 have a plurality of engaging notches 111, respectively. A plurality of buttons 112 is disposed on the first circuit board 11. A plurality of knobs 121 is disposed on the second circuit board 12. The first circuit board 11 has a plurality of through holes 113 corresponding in position to the knobs 121. The knobs 121 pass through the through holes 113 and are exposed on the first circuit board 11.

The retaining seat 20 is parallel with and connected to the first circuit board 11. The retaining seat 20 is located in front of the first circuit board 11. The front of the retaining seat 20 has an accommodating space 21. The retaining seat 20 has a plurality of engaging legs 22 extending backward from two sides of the retaining seat 20 and corresponding to the engaging notches 111. The engaging legs 22 are engaged with the engaging notches 111 of the first circuit board 11, so that the retaining seat 20 is connected to the first circuit board 11. A plurality of protruding posts 23 are disposed on the back of the retaining seat 20 to lean against the first circuit board 11. The circuit module 10 further includes a first protective sheet 14 on the front of the first circuit board 11. The first protective sheet 14 is located between the first circuit board 11 and the retaining seat 20. Two side wings 141 extend backward from the upper and lower side edges of the first protective sheet 14. The side wings 14 are perpendicular to the first protective sheet 14. The side wings 141 are located on the upper and lower sides of the first circuit board 11 and the second circuit board 12, respectively. The first protective sheet 14 not only forms an insulating protection effect on the front of the first circuit board 11 but also forms an insulating protection effect on the upper and lower sides of the first circuit board 11 and the second circuit board 12. One side of the retaining seat 20 is formed with a slot 24. The retaining seat 20 further has a reinforcing portion 25 on the outer side of the slot 24. The reinforcing portion 25 includes a plurality of engaging grooves, which not only provides a locking position but also has the effect of strengthening and protecting the retaining seat 20.

The liquid crystal panel 30 is accommodated in the accommodating space 21. The liquid crystal panel 30 is electrically connected to the first circuit board 11 through a flat flexible cable 31. One end of the flat flexible cable 31 is connected to the liquid crystal panel 30. The other end of the flat flexible cable 31 passes through the slot 24 and is connected to the back of the first circuit board 11. The liquid crystal panel 30 is provided with a second protective sheet 32 at the outer side of the flat flexible cable 31. One end of the second protective sheet 32 is parallel with and attached to the flat flexible cable 31. The other end of the second protective sheet 32 is bent vertically and passes through the slot 24 to protect the flat flexible cable 31.

In order to further understand the structural features, the technical means and the expected effect of the present invention, the use of the present invention is described below.

Figure 5:
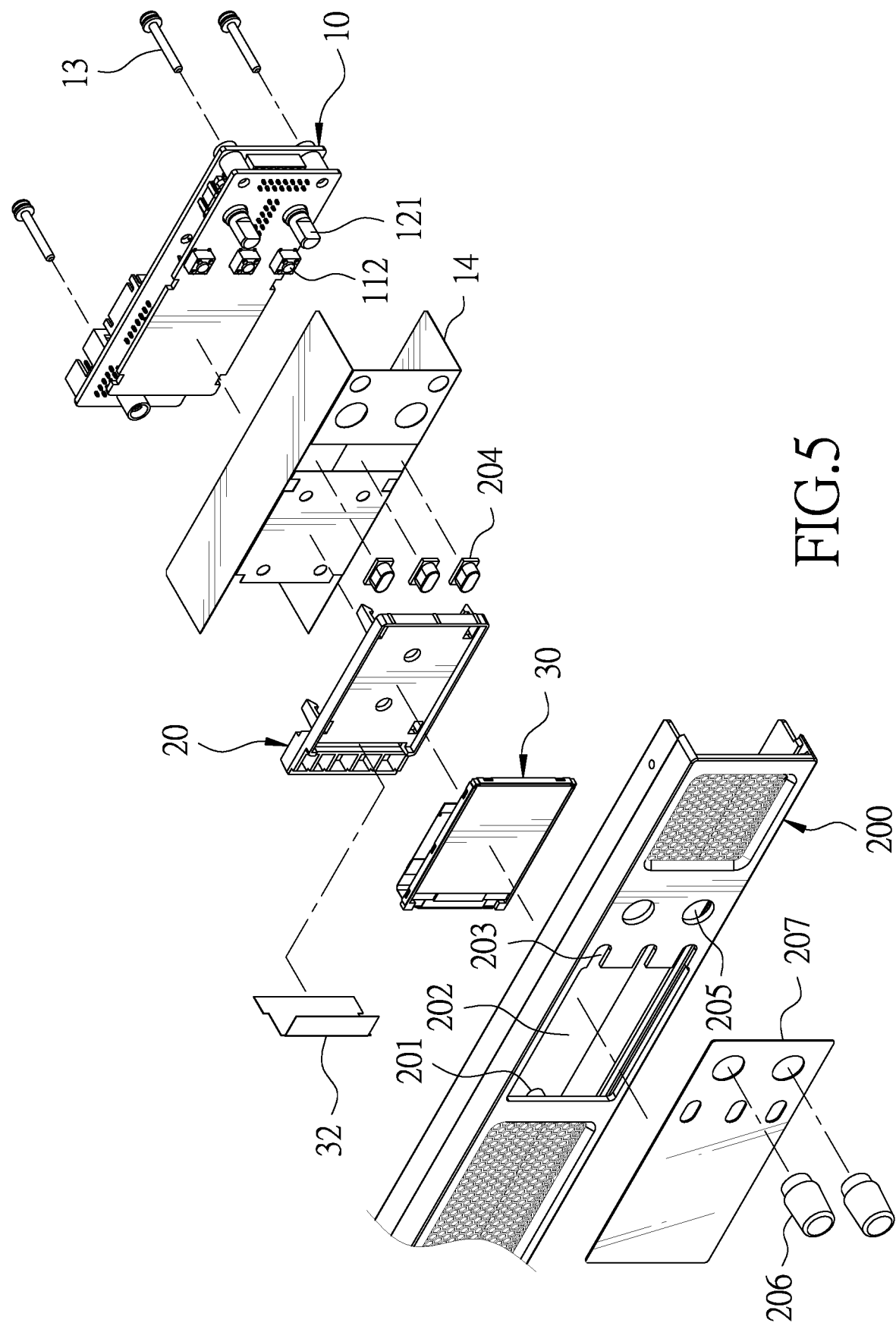
FIG. 5 is an exploded view of the preferred embodiment of the present invention mounted to a frame.
Figure 6:
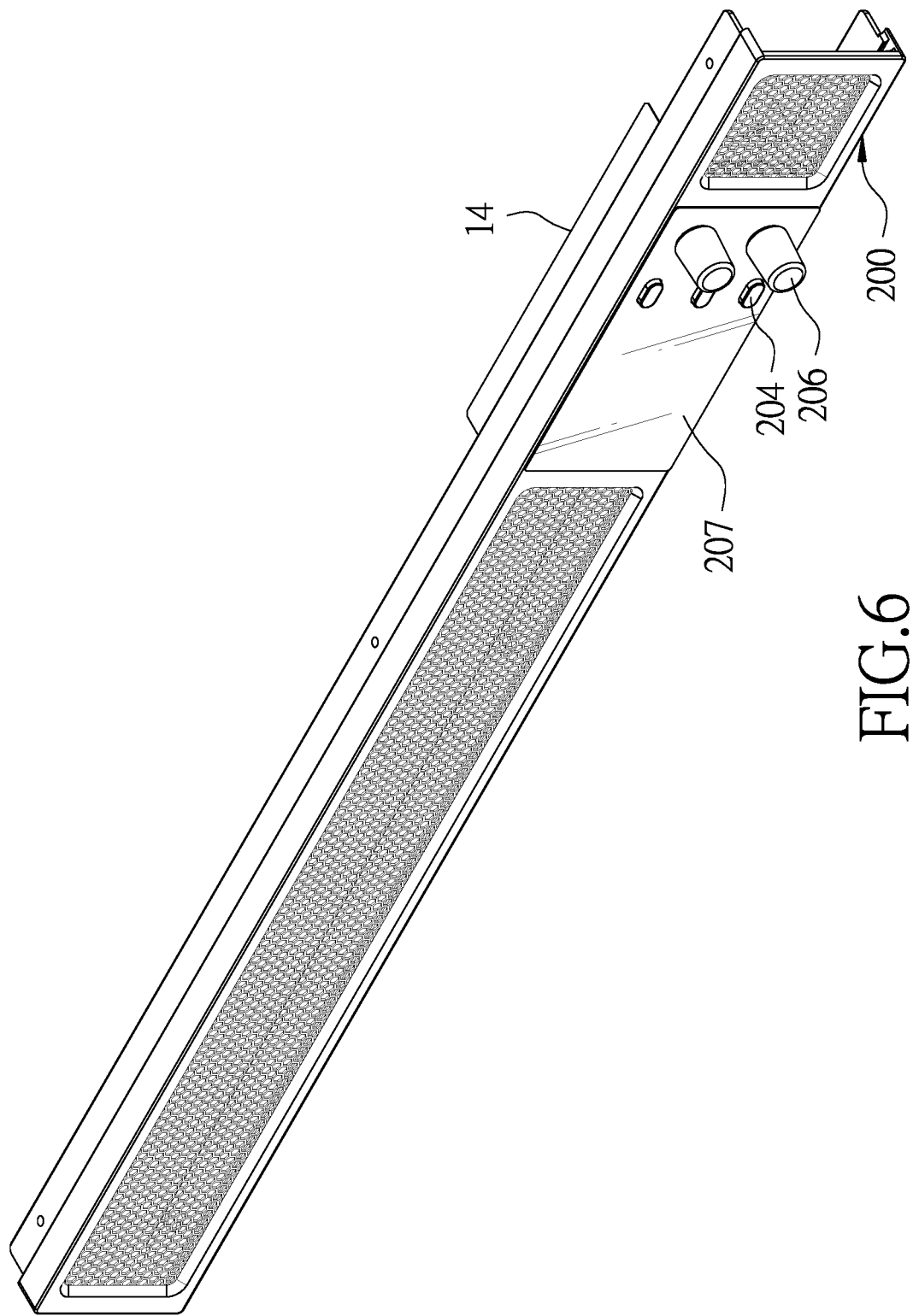
FIG. 6 is a perspective view of the preferred embodiment of the present invention mounted to the frame.
Figure 7:
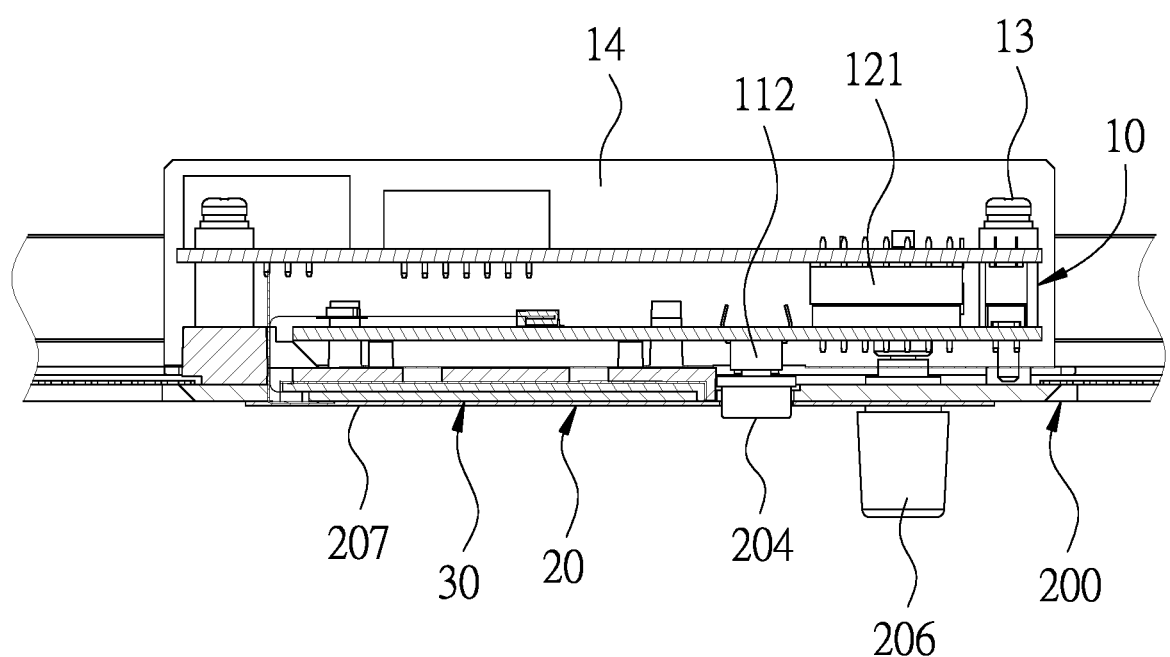
FIG. 7 is a cross-sectional view of the preferred embodiment of the present invention mounted to the frame.

Referring to FIGS. 5 to 7, in use, the present invention is mounted to a frame 200 on the front of a power supply. The back of the frame 200 is provided with a plurality of screw seats 201. The first circuit board 11 and the second circuit board 12 are locked to the screw seats 201 by the screws 13, so that the circuit module 10 is fixed to the back of the frame 200. The frame 200 has a panel opening 202 corresponding to the liquid crystal panel 30. The frame 200 further has a plurality of button openings 203 and a plurality of button caps 204 corresponding to the buttons 112. The frame 200 further has a plurality of knob openings 205 and knob caps 206 corresponding to the knobs 121. The frame 200 is provided with a protective film 207 corresponding in position to the panel opening 202, the button openings 203 and the knob openings 205 for protecting the liquid crystal panel 30. When the circuit module 10 is locked to the frame 200, the liquid crystal panel 30 is located in the panel opening 202 and attached to the frame 200. The buttons 112 extend out of the button openings 203. The knobs 121 extend out of the knob openings 205. Finally, the protective film 207 is attached to the surface of the frame 200. Thus, the human-machine interface module structure provided by the present invention is mounted to the frame 200.

As the above description, in the present invention, the panel, the buttons and the knobs of the man-machine interface are all integrated on the circuit module 10. Through the design of the first circuit board 11 and the second circuit board 12 being stacked in parallel, the volume of the circuit module 10 can be minimized. In addition, the liquid crystal panel 30 is securely fixed to the circuit module 10 and is flush with the surface of the frame 200 through the retaining seat 20 and the protruding posts 23 on the back of the retaining seat 20, so that the liquid crystal panel 30 won't be easily detached or dented. The human-machine interface module structure provided by the present invention is not only small in size but also has the advantages of being easy to assemble and durable.

Although particular embodiments of the present invention have been described in detail for purposes of illustration, various modifications and enhancements may be made without departing from the spirit and scope of the present invention. Accordingly, the present invention is not to be limited except as by the appended claims.

What is claimed is:

1. A human-machine interface module structure, comprising a circuit module, a retaining seat, and a liquid crystal panel;
    the circuit module being fixedly connected to a frame, the circuit module including a first circuit board and a second circuit board that are stacked in parallel, the first circuit board being fixedly connected to an inner side of the frame, the second circuit board being located behind the first circuit board, the first circuit board being electrically connected to the second circuit board, two side edges of the first circuit board having a plurality of engaging notches, respectively;
    the retaining seat being parallel with and connected to the first circuit board, the retaining seat being located in front of the first circuit board, a front of the retaining seat having an accommodating space, the retaining seat further having a plurality of engaging legs extending backward from two sides of the retaining seat and corresponding to the engaging notches, the engaging legs being engaged with the engaging notches of the first circuit board so that the retaining seat is connected to the first circuit board, a plurality of protruding posts being disposed on a back of the retaining seat to lean against the first circuit board;
    the liquid crystal panel being accommodated in the accommodating space, the liquid crystal panel being electrically connected to the first circuit board through a flat flexible cable;
    one side of the retaining seat is formed with a slot, one end of the flat flexible cable is connected to the liquid crystal panel, and another end of the flat flexible cable passes through the slot and is connected to the first circuit board;
    the circuit module further includes a first protective sheet on a front of the first circuit board, the first protective sheet is located between the first circuit board and the retaining seat, two side wings extend backward from upper and lower side edges of the first protective sheet, the side wings are perpendicular to the first protective sheet, and the side wings are located on upper and lower sides of the first circuit board and the second circuit board, respectively;
    a plurality of buttons is disposed on the first circuit board, a plurality of knobs is disposed on the second circuit board, the first circuit board has a plurality of through holes corresponding in position to the knobs, and the knobs pass through the through holes;
    a second protective sheet is disposed at an outer side of the flat flexible cable, one end of the second protective sheet is parallel with and attached to the flat flexible cable, and another end of the second protective sheet is bent vertically and passes through the slot to be located at the outer side of the flat flexible cable;
    the first circuit board and the second circuit board are locked to the frame by a plurality of screws; and
    the retaining seat further has a reinforcing portion at an outer side of the slot, the reinforcing portion includes a plurality of engaging grooves for locking and strengthening the retaining seat and protecting the flat flexible cable.

* * * * *